(12) United States Patent
Acosta et al.

(10) Patent No.: US 6,192,100 B1
(45) Date of Patent: Feb. 20, 2001

(54) X-RAY MASK PELLICLES AND THEIR ATTACHMENT IN SEMICONDUCTOR MANUFACTURING

(75) Inventors: Raul Edmundo Acosta, White Plains; Michael James Cordes, Newburgh; Steven Alan Cordes, Courtlandt Manor, all of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/335,980

(22) Filed: Jun. 18, 1999

(51) Int. Cl.[7] ........................................... G21K 5/00
(52) U.S. Cl. ........................... 378/35; 378/34; 430/5
(58) Field of Search ........................... 378/34, 35; 430/5

(56) References Cited

U.S. PATENT DOCUMENTS

| | | | |
|---|---|---|---|
| 4,131,363 | 12/1978 | Shea et al. | 355/75 |
| 4,198,263 | 4/1980 | Matsuda | 156/639 |
| 4,539,070 | 9/1985 | Jarocinski et al. | 156/659.1 |
| 4,548,883 | * 10/1985 | Wagner | 430/5 |
| 4,606,803 | 8/1986 | Lüthje et al. | 204/192 |
| 4,608,326 | * 8/1986 | Neukermans | 430/5 |
| 4,971,851 | 11/1990 | Neukermans et al. | 428/137 |
| 5,663,016 | 9/1997 | Hong . | |
| 5,675,403 | 10/1997 | Cerrina et al. . | |
| 5,793,836 | 8/1998 | Maldonado et al. | 378/35 |
| 5,809,103 | 9/1998 | Smith et al. . | |
| 5,958,631 | * 9/1999 | Acosta et al. | 430/5 |
| 6,101,237 | * 8/2000 | Miyachi et al. | 378/35 |

FOREIGN PATENT DOCUMENTS

| | | |
|---|---|---|
| 63-72119 | 4/1988 | (JP) . |
| 64-13551 | 1/1989 | (JP) . |

* cited by examiner

*Primary Examiner*—David V. Bruce
*Assistant Examiner*—Pamela R. Hobden
(74) *Attorney, Agent, or Firm*—Daniel P. Morris; Alvin J. Riddles

(57) ABSTRACT

In the invention a pellicle mounting structural principle is provided whereby a membrane for protection of an X-ray mask is interchangeably positioned with proper spacing between the X-ray mask and the resist on the wafer in which the pattern produced by the X-ray exposure is to be formed. The mounting principle employs a combined assembly of, a membrane and spacer member subassembly together with a means for seectably separable retention to the supporting structural portion of the mask The principle accommodates membrane materials that may not be flexible and provides an ability to remove the membrane for cleaning or replacement and to removal and reassembly with ease in reestablishing the spacing with respect to the mask. The means for the selectably separable retention to the supporting structural portion of the mask involves the use of springs and elastomers, securing to the sides of the supporting structural mask ring and the bonding of the spacer member directly to the mask.

18 Claims, 4 Drawing Sheets

X-RAY MASK PELLICLES AND THEIR ATTACHMENT IN SEMICONDUCTOR MANUFACTURING

CROSS REFERENCE

Ser. No. 09/335,536 filed assigned to the assignee of this application and is part of an ongoing effort in this technology and which is incorporated herein by reference.

FIELD OF INVENTION

The invention relates to pattern replication using x-rays and in particular to an X-ray mask mounting device called a pellicle, which serves to provide a spacing function and to protect the x-ray mask from contamination in semiconductor manufacturing.

BACKGROUND OF THE INVENTION AND RELATION TO THE PRIOR ART

The manufacturing of semiconductor integrated circuit devices is dependent upon the accurate replication of generated patterns onto the surface of a device substrate. This is usually accomplished by the production of a computer generated pattern into a chromium layer on a quartz substrate, and the pattern is then transferred via optical lithography. The replication operation is effected using a variety of processes; such as subtractive, for example etching; additive, for example deposition; and, by using such material modification techniques as oxidation, and ion implantation. Heretofore in the art, optical lithography, which is a projection printing technique has been employed in the replication process. In optical lithography the mask is located some distance from the wafer to be exposed and a four or five times reduction between the mask image and the wafer image can be involved, which simplifies both the lithography and mask production and in turn provides tolerance of defects.

As the art is progressing, the desire for greater density, is making the use of X-ray replication directly on the wafer very attractive. The considerations in using X-ray replication however are quite formidable. The X-ray technique involves proximity replication so that the X-ray mask images are made the same size as the final images on the wafer. Because of the one-to-one relationship of the image on an X-ray mask and the image formed on the wafer, any position errors in building the X-ray mask are replicated one for one onto the wafer. Thus, the position accuracy requirements for the fabrication of X-ray masks are very difficult to achieve and, as a result, X-ray masks are expensive to fabricate. In use, particles unavoidably settle on masks, but the ability, previously available in optical lithography, of keeping settled particles outside of the depth of focus window in the replication so that the particle is highly de-focused and does not print, is no longer available in the X-ray proximity replication. In some situations a particle that settled on a mask can absorb X-ray photons and must be removed. A major source of a settling particle problem comes from the effect of the X-ray energy on the resist material that form the desired patterns. When the x-ray resist is irradiated, organic material is released from the resist Because X-ray lithography is a proximity printing process, this material will travel the short distance between the mask and the wafer and then land on the x-ray mask. In particular, this material is prone to bonding to the x-ray mask absorber pattern. In a short time, this organic material begins to attenuate the x-rays resulting in longer exposure times, dimensional control problems, and pattern defects. This accumulation of contamination would ordinarily necessitate cleaning of the x-ray mask. However, due to the expense and fragility of the x-ray masks, and the risk involved with cleaning them, this is not considered to be a reasonable solution.

It is therefore important to protect the relatively delicate and not easily cleaned X-ray masks from contaminants and mechanical damage due to scratches and the like without introducing mechanical stresses that may affect the placement accuracy.

There has been some activity in the art directed to this problem in U.S. Pat. No. 5,793,836 in which a protective structure is described which provides a membrane that would lie between the mask and the wafer to assist in protecting the mask from contamination.

As progress with membranes advances a need is being encountered for less fragile and easier to mount structures.

SUMMARY OF THE INVENTION

In the invention a pellicle mounting structural principle is provided whereby a membrane for protection of an X-ray mask is interchangeably positioned with proper spacing between the X-ray mask and the resist on the wafer in which the pattern produced by the X-ray exposure is to be formed. The mounting principle employs a combined, membrane and rigidity and spacer member, together with a means for selectably separable retention to the supporting structural portion of the mask. The principle accommodates membrane materials that may not be flexible and provides an ability to remove the membrane for cleaning or replacement and to do it with ease in reestablishing the spacing with respect to the mask The means for the selectably separable retention to the supporting structural portion of the mask involves the use of springs and elastomers, securing to the sides of the supporting structural mask ring and the bonding of the spacer member directly to the mask

DESCRIPTION OF THE INVENTION

Figure 1:
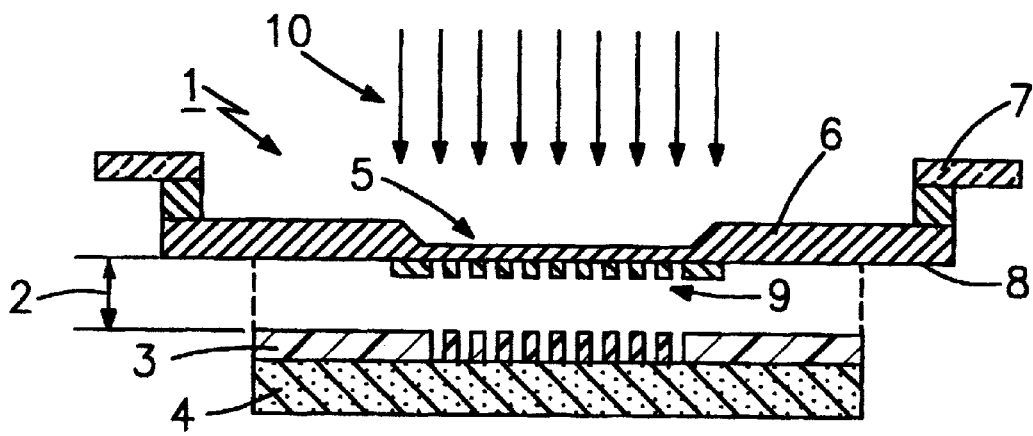
FIG. 1 is an expanded cross sectional diagram of the prior art x-ray lithography showing the configuration of the x-ray mask with respect to the device wafer.
Figure 2:
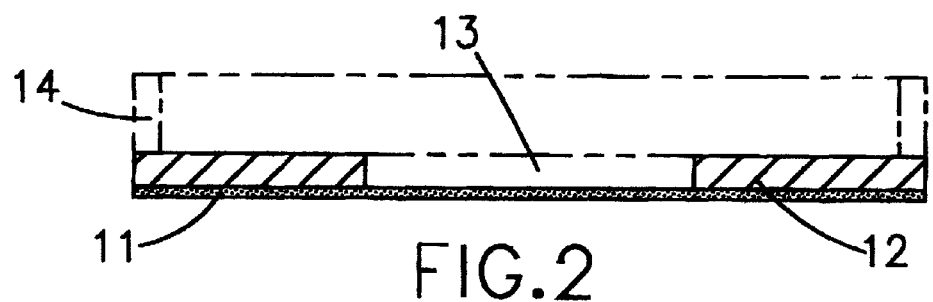
FIG. 2 is a cross sectional depiction of the pellicle mounting principle of the invention showing the combined membrane and rigidity and spacer member together with a means for selectably separable retention to the rigidity imparting portion of the mask

A pellicle mounting approach is provided in which a membrane, that protects the X-ray mask from contaminating particles that principally come out of the resist on the wafer and settle on the mask, is mounted so that the membrane not only keeps contamination off the mask, the mounting pellicle also serves a membrane spacing function rendering the pellicle readily and accurately removable for cleaning or replacement Referring to FIG. 1 there is shown an exploded cross sectional view of a typical prior art x-ray mask 1 that is positioned in proximity printing position separated by a relatively narrow gap 2 of the order of about 5 to 40 micrometers in relation to an X-ray resist 3 that is on an integrated circuit wafer 4. The mask 1 is made up of a thinned region 5 about 2 micrometers thick and about 1 inch square that is supported at the periphery by a bulk support portion 6 of for example silicon, which in turn is mounted on and supported by a structural support ring 7 of a material such as pyrex(TM) that is about 4 inches in diameter. On the face 8 of the thin region 5 of the mask 1 there is an absorber pattern 9 of X-ray opaque material of for example Au, W, or TaSi. The absorber pattern 9 is transferred via x-rays 10 across the gap 2 onto a x-ray resist 3, which is on a device wafer 4. A major problem in the prior art of the type depicted in FIG. 1 is that contaminating particles usually of organic material driven out of the resist 3 by the X-rays tend to settle on the mask and cause a need for cleaning. Any cleaning however must be done with a realization that the pattern, being a one for one replica, will require great care because it is delicate and will be expensive to reproduce if damaged. Referring to FIG. 2 there is shown a cross sectional depiction of the basic structural aspects of the pellicle mounting in accordance with the invention. In the invention there is provided a membrane 11 of the order of about 1 micrometer thick of a material with minimal X-ray attenuation and which does not distort the X-ray pattern and can serve to protect the absorber pattern 9 from wear and contamination. The membrane 11 is supported by and given rigidity through, a spacer member 12 that has a thickness slightly greater than the thickness of the absorber pattern 9, as shown in FIG. 1, extending from the surface 8 of the mask 1, which is about 2 micrometers. The pellicle mounting of FIG. 2 is positioned in the gap labelled 2 in FIG. 1 between the absorber pattern 9 and the resist 3 on the wafer 4 being patterned. In the pellicle mounting structure of the invention as shown in FIG. 2, the membrane 11 is perfectly flat in intimate contact with the spacer 12 and is free of any bending requirement, so that it can be of a wider range of materials including for example inorganic material such as a member of the group of Si, $Si_3N_4$, SiC, or Diamond. The spacer member 12 can be of any material that can impart the desired rigidity and can withstand the processing temperatures likely to be encountered. The spacer member 12 should be in a shape similar to a washer that does not extend into an open region 13 through which the energy through the absorber pattern 9 of the X-ray mask is to pass. The washer shaped spacer member 12 with the membrane 11 over one surface and across the open region 13 is made by standard procedures in the art such as chemical vapor deposition of the membrane 11 on a wafer with a boron diffused layer of the desired thickness in the shape of a washer followed, by removal of the region 13 by silicon wet etching. The membrane 11 and spacer member 12 are somewhat fragile and are provided with retention means for handling and that attach the combination to the mask, in position within the gap 2 distance, and with the absorber pattern 9 of the mask surrounded by the spacer member 12. The retention means can be a peripheral attachment member or merely the attachment of the spacer 12 to the surface 8 of the mask. The membrane 11 and spacer 12 combination basic structure of the invention as illustrated in FIG. 2, make it possible to use inorganic and high processing temperature materials that are amenable to precision processing. The use of boron doped silicon for the spacer 12 and for the membrane 11 has the advantage of being compatible with high temperature processes up to 1100° C., and permits the use of well understood and readily available silicon etchants. Further, a pellicle mounting element of such a material has low tensile stress.

Where the retention means is a peripheral ring as shown dotted in FIG. 2 as element 14, the material silicon as the material for the ring will add ridgidity during processing and mounting as well as preventing any defects to the planarity of the membrane surface.

Figure 3:
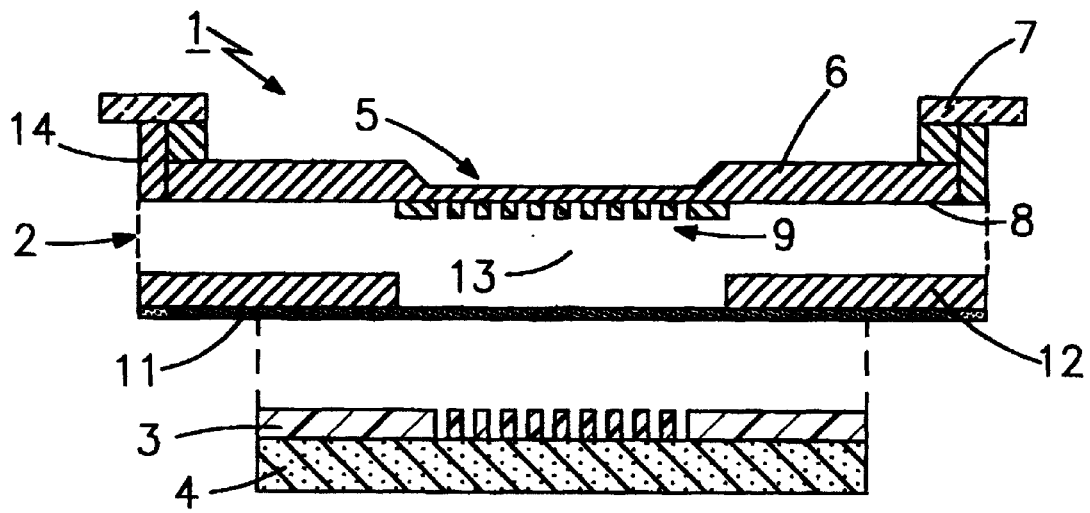
FIG. 3 is an exploded view of the x-ray pellicle mounting principle of the invention as it would be used in conjunction with an x-ray mask and wafer.

FIG. 3 is an expanded, cross sectional, separated as shown dotted, view of the x-ray pellicle mounting principle of the invention wherein the same reference numerals as in previous figures are used where appropriate, and as it would be used in conjunction with a standard x-ray mask and wafer as shown in FIG. 1. When the expanded view is in use, the resist 3 on the wafer 4 would be in close proximity and separated by a gap from the membrane 11; one surface of the washer shaped spacer 12 would be in contact with the face 8 of the mask 1; and the absorption pattern 9 of the mask 1 would be in the opening 13 in the spacer surrounded by the spacer 12. Thus, the absorption pattern 9 is protected on the sides and over the face near the resist 3 it is protected from contamination by the membrane 11. The thickness of the spacer 12 positions the membrane 11 in the gap 2, proximate to but with a clearance of about 1 micrometer from the absorption pattern 9.

The retention means for attaching the pellicle mounting in one embodiment can be a peripheral ring 14 as shown dotted in FIG. 2 that is bonded or glued to the portion of the spacer member 12 beyond the mask 1 and to mask structural support ring 7 at a shoulder 15. Thus the retention means, in the ring 14 embodiment retains the pellicle assembly on the mask 1 with the surface of the spacer 12 in contact on one side with the face 8 of the mask 1 and with the membrane 11 in contact with the other surface of the spacer 12. The washer shaped spacer 12 surrounds the absorption pattern 9 of the mask 1 and establishes the position of the membrane 11 in the relatively narrow about 5 to 40 micrometer gap 2 with the membrane 11 covering, with a small clearance, the absorption pattern 9. The ring 14 embodiment is attached on one edge to the support ring 7 and on the other edge to the spacer 12 when the pellicle is assembled on the mask 1 with the upper surface of the washer shaped spacer 12 in contact with the face 8 of the mask 1.

Figure 4:
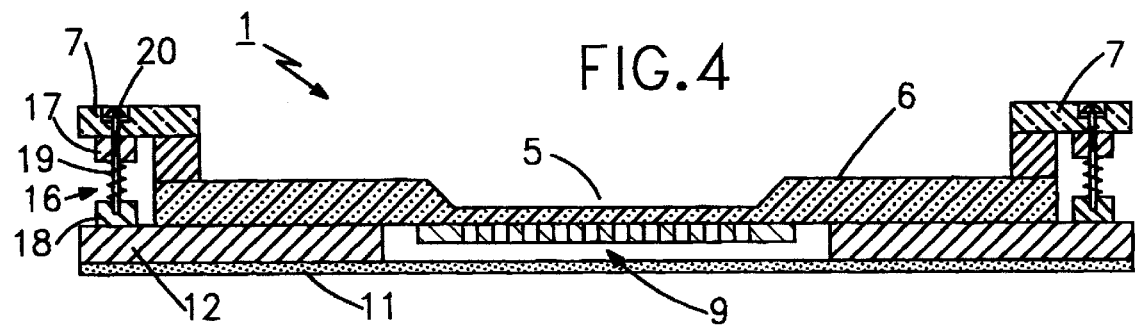
FIG. 4 is a cross sectional view that shows a spring loaded embodiment of the invention.
Figure 5:
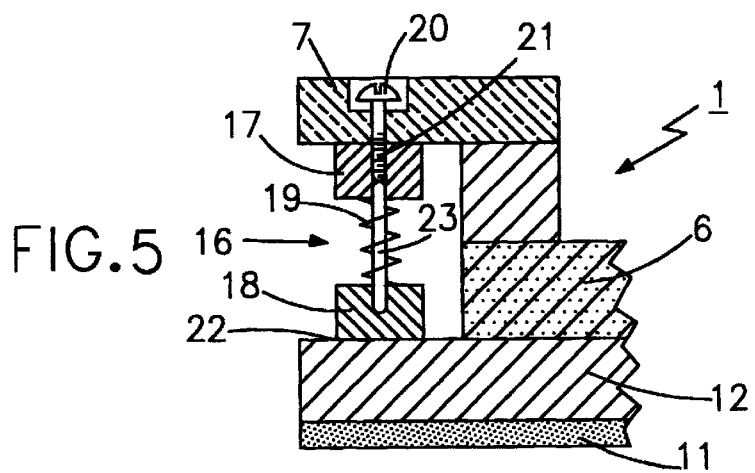
FIG. 5 is a detailed view of one spring loaded portion of FIG. 4

In another embodiment of the retention means requirement of the pellicle mounting of the invention, a spring and guiding rod between two superimposed ring portions may be used. In this type of embodiment, the overall mask and pellicle structure is shown in cross section in FIG. 4, using the same reference numerals as in previous figures where appropriate, and a larger detail of one of the spring and guiding rod assembles is shown in FIG, 5. There are as many spring and guiding rod assemblies around the structural support ring 7 as are needed for maintaining planarity of the parts. Referring to FIGS. 4 and 5 a spring and superimposed ring assembly 16, provide the function of a retention means in securing the x-ray pellicle assembly of the spacer 12 and the membrane to the x-ray mask 1. Superimposed rings 17 and 18 are connected by a spring 19 that will be under tension when the ring 17 is retained to the ring 7 by a screw 20 with threads 21 in the ring 17 and where the ring 18 is bonded such as through an adhesive like epoxy to the spacer 12 at location 22. A guiding rod 23 is attached to ring 18 and extends to the tip of screw 20 thereby giving the assembly lateral rigidity. When assembled with the screw 20 drawn down tight to the structural support ring 7, the spring 19 is stretched slightly to provide a small force on the spacer 12 and membrane 11 combination. The spring 19 force must be small enough so as not to damage the membrane 11.

In still another embodiment of the retention means requirement of the pellicle mounting of the invention, an elastomer 25 applied across two superimposed ring portions may be used. In this type of embodiment, the overall mask and pellicle structure is shown in cross section in FIG. 6, using the same reference numerals as in previous figures where appropriate, and a larger detail of one of the elastomer and superimposed ring assembles is shown in Fig, 7. There are as many elastomer and superimposed ring assemblies around the structural support ring 7 as are needed for maintaining planarity of the parts.

Figure 6:
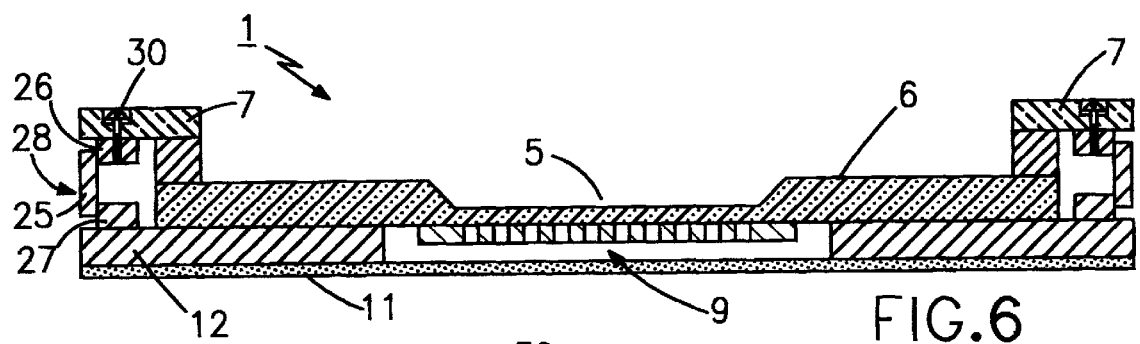
FIG. 6 is a cross sectional view that shows an elastomer retention embodiment of the invention.
Figure 7:
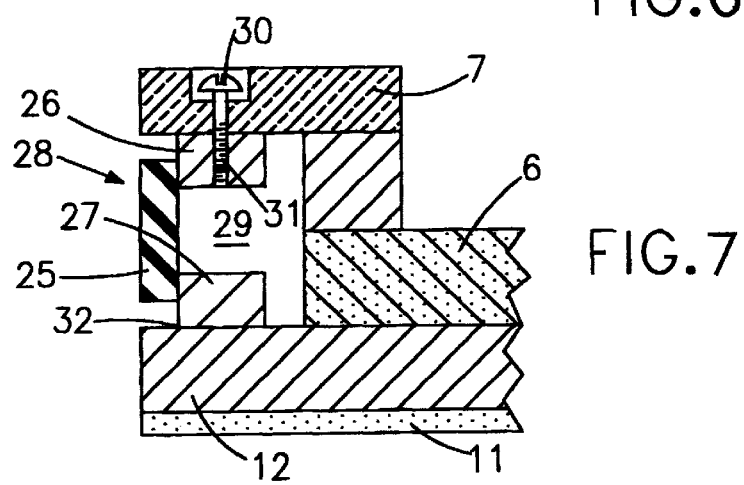
FIG. 7 is a detailed view of one one elastomer retention portion of FIG. 6.

Referring to FIGS. 6 and 7 an elastomer 25 and superimposed ring 26 and 27 assembly 28, in which the elastomer is bonded across the intersection 29 between the superimposed rings 26 and 27, provide the function of a retention means in securing the x-ray pellicle assembly of the spacer 12 and the membrane 11 to the x-ray mask 1. Of the superimposed rings 26 and 27, the ring 26 is retained to the ring 7 by a screw 30 with threads 31 in the ring 26 and the ring 27 is bonded such as through an adhesive like epoxy to the spacer 12 at location 32. When assembled with the screw 30 drawn down tight to the structural support ring 7, the elastomer 25 is stretched slightly to provide a small force on the spacer 12 and membrane 11 combination. The elastomer force 25 must be small enough so as not to damage the membrane 11.

In still another embodiment of the retention means requirement of the pellicle mounting of the invention, an elastic adhesive and a ring with a dimension so that the elastic adhesive is stretched when the pellicle is mounted is used. In this type of embodiment, the overall mask and pellicle structure is shown in cross section in FIG. 8, using the same reference numerals as in previous figures where appropriate, and a larger detail of one of the ring and elastic adhesive assembles is shown in Fig, 9.

Figure 8:
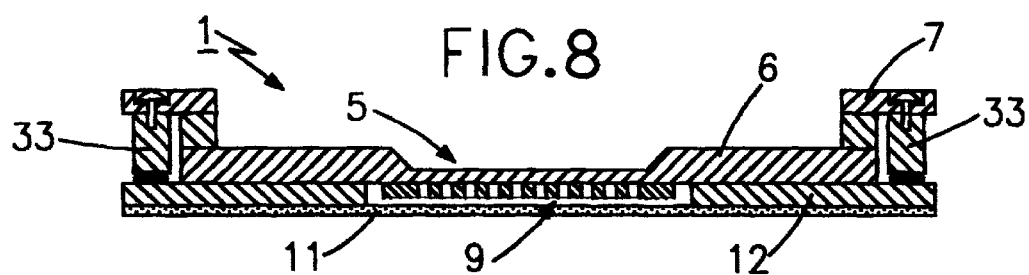
FIG. 8 is a cross sectional view in which a first side of a single retention ring is first glued to the pellicle using an elastic adhesive and the second side of the retention ring is attached to the support ring of the x-ray mask.
Figure 9:
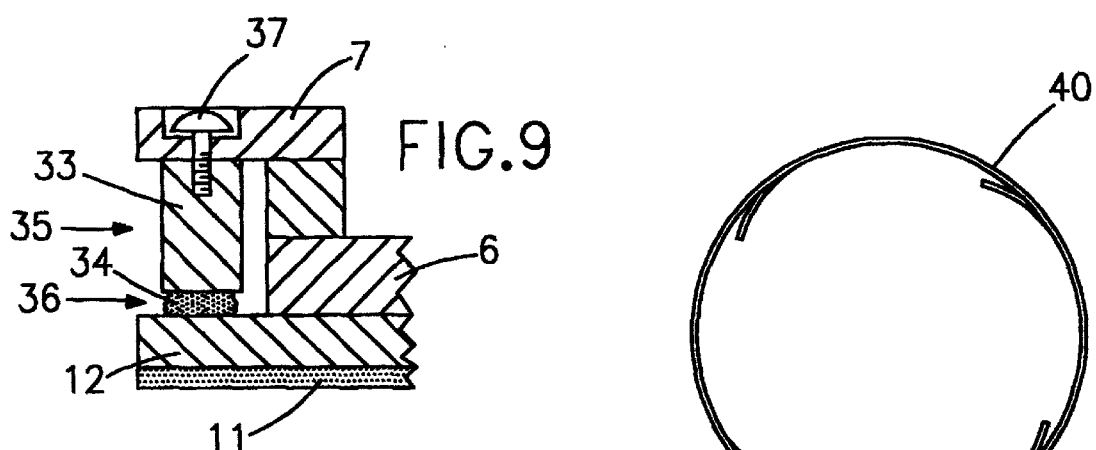
FIG. 9 is a detailed view of one one retention portion of FIG. 8.

Referring to FIGS. 8 and 9 a ring 33 and an elastic adhesive 34 assembly 35, is positioned between the support ring 7 and the spacer 12 when the pellicle is mounted on the mask 1 and provide the function of a retention means in securing assembly of the spacer 12 and the membrane 11 to the x-ray mask 1. The height dimension of the ring 33 is less than the distance between the support ring 7 and the spacer 12 so that an elastic adhesive 34 at the location 36 is stretched and provides a force joining the spacer 12 to the support ring 7 when the parts are assembled. The ring 33 is attached to the support ring 7 through a screw 37 that places the elastic adhesive under tension when the screw 37 is tightened which in turn provides a small force on the spacer 12 and membrane 11 combination. The elastic adhesive 34 force must be small enough so as not to damage the membrane 11.

Figure 10:
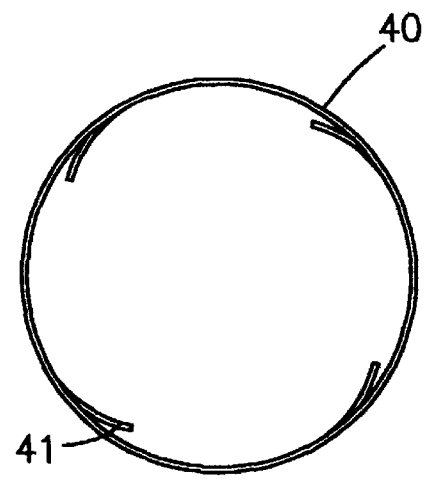
FIGS. 10–13 shows plan, elevational, perspective and cross sectional views of an embodiment of the invention in which a single ring has slots cut in it to produce tabs which frictionally secure the pellicle to the edge of the X-ray mask supporting ring.
Figure 12:
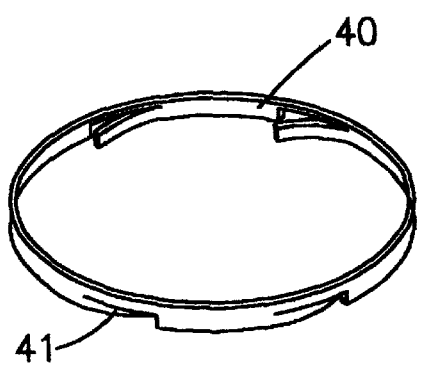
Figure 11:
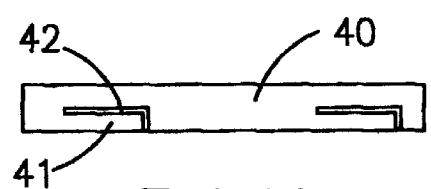
Figure 13:
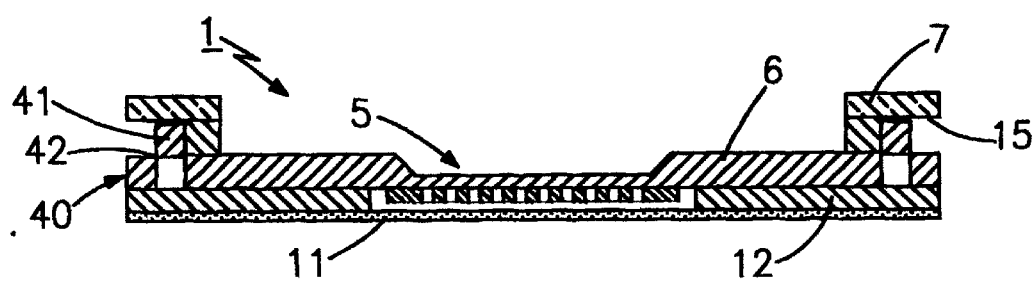

Referring next to FIGS. 10–13 which show plan, elevational, perspective and cross sectional views of a friction attachment embodiment of the retention means requirement of the pellicle mounting of the invention, in which a single attachment ring 40 has tabs 41 bent inward from portions formed by slots 42. The tabs 4 operate to grip the edge of the X ray mask supporting ring. 7 and thereby retain the spacer 12 and membrane 11 combination in position on the X-ray mask. FIG. 10 is a top view in which the tabs 41 have been bent toward the supporting ring 7 which the attachment ring 40 surrounds. For this embodiment, the attachment ring 40 would likely be made of a material with a high spring property such as beryllium copper. FIG. 11 is a side view illustrating the tab 41 producing slots 42 in which the tab 41 portions are formed by a slot 42 that is transverse to the edges for about half the distance between the edges then parallel to the edges for a distance about twice the distance between the edges. FIG. 12 is a perspective view of the ring 40 with the tabs 41 bent inward. The attachment friction increases with the number of tabs and the distance they are bent inward. Referring to FIG. 13, to implement this embodiment, portion of the ring 40 that is the side opposite the tabs 41 would be glued to the spacer 12. The tabs 41 would be stretched outward slightly to allow the ring 40 to fit over the portion 6 of the x-ray mask. When the tabs 41 are released they will grip the sides of the portion 6 and the structural support ring 7 of the x-ray mask below the shoulder 15, securing the spacer 12 and membrane 11 combination in place.

It will be apparent to one skilled in the art that the principles of the invention apply as well to appropriately mounted masks with shapes other than circular such as square.

In still another embodiment of the retention means requirement of the pellicle mounting of the invention, an arrangement for the use of screw threads is provided. In this type of embodiment, the overall mask and pellicle structure is shown in cross section in FIG. 14, using the same reference numerals as in previous figures where appropriate, and a larger detail of the threaded intersection assembly is shown in FIG. 15.

Figure 14:
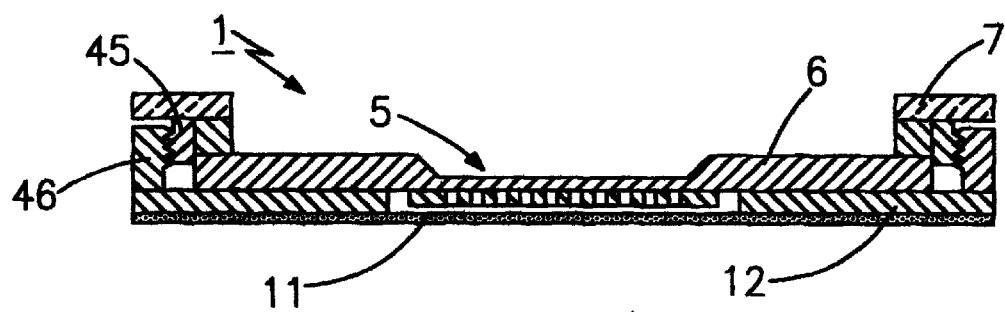
FIG. 14 shows an embodiment of the invention in which a ring with an outside thread is glued to the outer diameter of the supporting ring of the x-ray mask and a pellicle ring is threaded on the interior diameter such that the pellicle structure can be screwed onto the x-ray mask.
Figure 15:
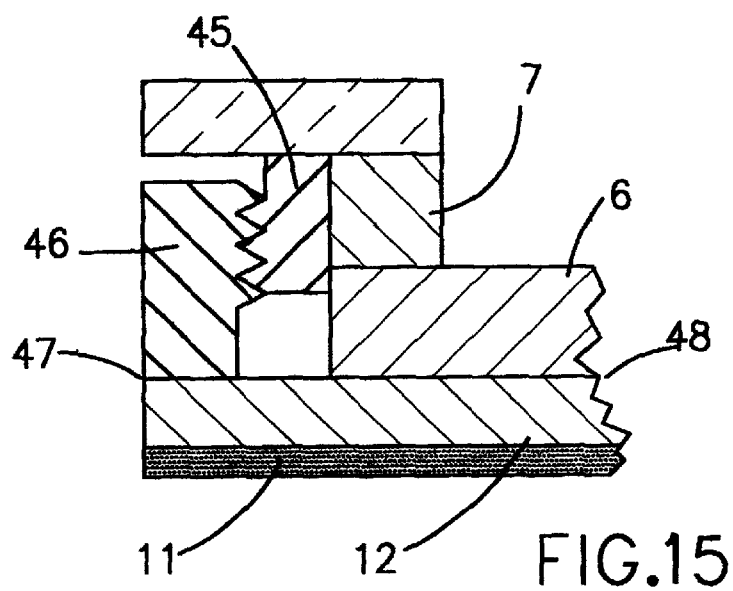
FIG. 15 is a detailed view of one threaded retention portion of FIG. 14.

Referring to FIGS. 14 and 15 a ring 45 threaded on the outer diameter is glued to the outer diameter of the structural support ring 7 of the X-ray mask. A pellicle retention ring 46 that is threaded on the inner diameter with a matching thread to that of ring 45, is glued or otherwise attached such as through the use of epoxy, at location 47 to the spacer 12.

In mounting the combination of the membrane 11 and the spacer 12 to the X-ray mask structural support ring 7 using the retention means made up of threaded rings 45 and 46 the ring 45 is screwed onto ring 45 until the mask portion 6 contacts the surface of the spacer 12 at location 48.

Figure 16:
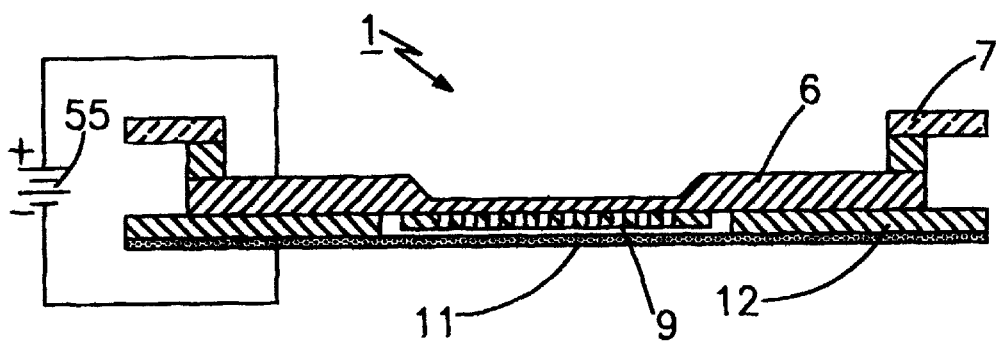
FIG. 16 shows an embodiment of the invention in which the spacer member of the pellicle is bonded directly to the surface of the x-ray mask using an electrostatic charge

In FIG. 16 an embodiment is depicted in which the retention means for holding the spacer 12 and membrane 11 combination on the X-ray mask is provided by a charge accumulation across the interface between the spacer 12 and the X-ray support ring 7. In the embodiment of FIG. 16 the spacer is made of bulk silicon and is formed directly on the surface of the X-ray mask. A direct current voltage source 55 is connected across the interface and with a dielectric film at the interface a capacitive charge accumulation occurs producing an electrical attraction between the parts that holds the pellicle in place even after the voltage source 55 is disconnected.

What has been described is a pellicle mounting structural principle whereby a membrane for protection of an X-ray mask is removably positioned between the absorber pattern on the X-ray mask and the resist on the wafer.

What is claimed is:

1. A pellicle member for protection of an X-ray exposure area absorber pattern that is positioned on and that extends a distance from a surface of a circular X-ray mask having an outside diameter and a support ring with a shoulder extending beyond said outside diameter, comprising in combination:
 a subassembly of a circular membrane member on a washer shaped spacer member,
  said spacer member having,
   first and second essentially parallel surfaces,
   a central opening through said spacer member having a diameter to accommodate said absorber pattern,
   an outside diameter in the vicinity of said outside diameter of said mask, and,
   a thickness dimension between said first and second essentially parallel surfaces greater than and in the vicinity of said distance said absorber pattern extends from said mask surface,
  said membrane member having,
   a thickness dimension that is small relative to said thickness dimension of said spacer member, and,
   in contact with all of said first surface of said spacer member, and,
 retention means adapted to retain said subassembly to said mask as an assembly, in which,
  said second surface of said spacer member is in contact with said mask surface from which said absorber pattern extends, and,
  said absorber pattern extends into said central opening in said spacer member.

2. The pellicle member of claim 1 where said retention means is an electrostatic charge across the interface of said mask and said spacer member.

3. The pellicle member of claim 1 wherein said membrane member is of a material that is a member of the group of Si, $Si_3N_4$, SiC and Diamond.

4. The pellicle member of claim 3 wherein said spacer member is of boron doped silicon.

5. The pellicle member of claim 3 wherein said support ring is of pyrex material.

6. The pellicle member of claim 5 wherein absorber pattern is of a material taken from the group of Au, W or TaSi.

7. The pellicle member of claim 1 wherein said mask support ring shoulder portion has an outside diameter that is greater than said outside diameter of said mask and said retention means includes at least one ring member and first and second attachments said first attachment being of a first portion of said at least one ring member to said shoulder portion by at least one of adhesive and screw means, and said second attachment being of a second portion of said at least one ring member to an extending portion of said second surface of said spacer by adhesive means.

8. The pellicle member of claim 7 wherein said retention means is a single ring member having an inside diameter that fits over said outside diameter of said mask, said first attachment being of a first portion of said single ring member to said shoulder portion by adhesive means, and said second attachment being of a second portion of said single ring member to an extending portion of said second surface of said spacer by adhesive means.

9. The pellicle member of claim 7 wherein said retention means is a single ring member having an inside diameter that fits over said outside diameter of said mask, said first attachment being of a first portion of said single ring member to said shoulder portion by screw means, and said second attachment being of a second portion of said single ring member to an extending portion of said second surface of said spacer by adhesive means.

10. The pellicle member of claim 7 wherein said retention means is superimposed first and second ring members each having an inside diameter that fits over said outside diameter of said mask, and being connected by a spring surrounding a rod between said first and second rings, said first attachment being of said first of said superimposed rings to said shoulder portion by screw means, and said second attachment being of said second of said superimposed rings to an extending portion of said second surface of said spacer by adhesive means.

11. The pellicle member of claim 7 wherein said retention means is superimposed first and second ring members each having an inside diameter that fits over said outside diameter of said mask, and being connected by an elastomer member adhesively attached to each said superimposed ring and extending across the intersection between them, said first said superimposed rings being attached to said shoulder portion by screw means, and said second of said superimposed rings being attached to an extending portion of said second surface of said spacer by adhesive means.

12. The pellicle member of claim 7 wherein said retention means is first and second ring members, said first ring member having an inside diameter that fits over said outside diameter of said mask, and being adhesively attached to said mask and to said shoulder and having threads on the outside diameter, said second ring member being attached to an extending portion of said second surface of said spacer by adhesive means and having threads in the inside diameter thereof that mesh with said threads on the outside diameter of said first ring member.

13. The pellicle member of claim 7 wherein said retention means is a single ring member having an inside diameter that fits over said outside diameter of said mask, said single ring member further having partial cuts producing bendable tabs that when bent inward provide a friction grip of said mask, and, attachment of an edge of said ring member to an extending portion of said second surface of said spacer by adhesive means.

14. In a pattern reproduction mask for use with X-rays wherein a circular bulk mask support member having first and second essentially parallel surfaces is supported at the periphery by a ring member, said bulk mask support member having a central thinned region in said first surface and having an absorber pattern of X-ray opaque material on said second surface in registration with said thinned region, the improvement comprising:
 a mask protecting pellicle, said pellicle including a membrane member on a washer shaped spacer member sub assembly,
  said spacer member having, first and second essentially parallel surfaces and a central opening through said spacer member having a diameter that will accommodate said absorber pattern, an outside diameter that is in the vicinity of said outside diameter of said mask, and, a thickness dimension between said first and second essentially parallel surfaces that is larger than and in the vicinity of, said distance said absorber pattern extends from said second surface of said bulk mask support member, said membrane member being positioned in contact with all of said first surface of said spacer member and having a thickness dimension that is small relative to said thickness dimension of said spacer member, and, retention means adapted to retain said subassembly to said X-ray pattern reproduction mask as an assembly, in which said second surface of said spacer member is in contact with said second bulk mask support surface from which said absorber pattern extends.

15. The improvement of claim 14 wherein said membrane member is of a material that is a member of the group of Si, $Si_3N_4$, SiC and Diamond.

16. The improvement of claim 15 wherein said spacer member is of boron doped silicon.

17. The improvement of claim 16 wherein said support ring is of pyrex material.

18. The improvement of claim 17 wherein said absorber pattern is of a material taken from the group of Au, W or TaSi.

* * * * *